United States Patent [19]

Ito et al.

[11] Patent Number: 4,892,839

[45] Date of Patent: Jan. 9, 1990

[54] METHOD OF MANUFACTURING A SEMICONDUCTOR DEVICE WITH POLYSILICON RESISTORS AND FIELD PLATE

[75] Inventors: Shinichi Ito; Hirokazu Kaneda, both of Kanagawa, Japan

[73] Assignee: Fuji Electric Co., Ltd., Kanagawa, Japan

[21] Appl. No.: 109,533

[22] Filed: Oct. 19, 1987

[30] Foreign Application Priority Data

Nov. 28, 1986 [JP] Japan ................... 61-283727

[51] Int. Cl.⁴ ........................... H01L 21/265
[52] U.S. Cl. ........................... 437/47; 437/31; 437/60; 437/918; 437/191; 437/193
[58] Field of Search ............ 437/162, 918, 60, 31, 437/47, 191, 193; 357/51, 34; 148/DIG. 122, 136, 53

[56] References Cited

U.S. PATENT DOCUMENTS

| | | | |
|---|---|---|---|
| 3,463,977 | 8/1969 | Grove et al. | 357/238 |
| 3,570,114 | 3/1971 | Bean et al. | 148/DIG. 122 |
| 3,576,478 | 4/1971 | Wakins | 148/DIG. 122 |
| 3,902,188 | 8/1975 | Jacobson | 148/DIG. 136 |
| 4,124,933 | 11/1978 | Nicholas | 148/DIG. 122 |
| 4,178,674 | 12/1979 | Liu et al. | 437/918 |
| 4,234,357 | 11/1980 | Scheppele | 437/162 |
| 4,244,001 | 1/1981 | Ipu | 148/DIG. 122 |
| 4,270,137 | 5/1981 | Coe | 357/53 |
| 4,411,708 | 10/1983 | Winhan | 437/918 X |
| 4,451,328 | 5/1984 | Dubois | 437/918 |
| 4,464,825 | 8/1984 | Ports | 437/918 X |
| 4,466,839 | 8/1984 | Dathe et al. | 437/918 X |
| 4,467,519 | 8/1984 | Glang et al. | 437/162 X |
| 4,569,123 | 2/1986 | Ishii et al. | 437/162 |
| 4,602,421 | 7/1986 | Lee et al. | 148/DIG. 36 |
| 4,612,563 | 9/1986 | Macdougall et al. | 357/54 |

FOREIGN PATENT DOCUMENTS 0173611 3/1986 European Pat. Off. .
1348697 3/1974 United Kingdom .

*Primary Examiner*—Brian E. Hearn
*Assistant Examiner*—T. Thomas
*Attorney, Agent, or Firm*—Finnegan, Henderson, Farabow, Garrett, & Dunner

[57] ABSTRACT

A method of manufacturing a semiconductor device in which a base of a second conductivity type is provided in a semiconductor substrate of a first conductivity type, which operates as a collector. An emitter of the first conductivity type is provided in the base, a pn junction between the collector and the base is exposed on the surface of the semiconductor substrate, and the emitter is provided with stabilizing resistors. The method comprises the steps of providing a silicon oxide film over the entire surface of the semiconductor device, and a polysilicon film over both the emitter and a first portion of the pn junction exposed on the surface of the semiconductor substrate, and impurities are diffused into only a second portion of the polysilicon film located over the emitter to reduce the resistance of the second portion of the polysilicon film.

2 Claims, 1 Drawing Sheet

METHOD OF MANUFACTURING A SEMICONDUCTOR DEVICE WITH POLYSILICON RESISTORS AND FIELD PLATE

BACKGROUND OF THE INVENTION

The present invention relates to a method of manufacturing a semiconductor device, particularly a high voltage transistor with high reliability.

It is known to use a stabilizing resistor in series with an emitter for a semiconductor device of a meshed emitter structure or multi-emitter structure, and that the emitter is made of a plurality of portions for the purpose of obtaining a high output. It is advantageous to use a polysilicon film as the stabilizing resistor for the emitter.

It is also known to provide a high-resistance sheet over a pn junction surface to enable the pn junction to block a high reverse voltage, so that the form of a depletion layer region related to the pn junction is changed to reduce the electric field strength in the depletion layer region, and to attain a high blocking voltage with high reliability. It is also advantageous to use a polysilicon film as the high-resistance sheet.

Thus, polysilicon films can be used as both the stabilizing resistor for the emitter and the high-resistance sheet over the pn junction surface. However, the resistance of the stabilizing resistor and that of the high-resistance sheet are about $10 \, \Omega/\square$ and $10^{10} \, \Omega/\square$, respectively, the difference between which is very large. For that reason, there is a drawback that a single polysilicon film cannot be used as both the stabilizing resistor and the high-resistance sheet.

SUMMARY OF THE INVENTION

Accordingly, it is an object of the present invention to provide a method of manufacturing a semiconductor device, in which a single polysilicon film is used as both a stabilizing resistor for an emitter and a resistance sheet over a pn junction having a high voltage capability, in a simple manner.

In the method, the polysilicon film is mutually provided over the emitter and the pn junction surface, and an impurity is diffused in the stabilizing resistor portion of the polysilicon film but not diffused in the resistance sheet portion of the film.

Since the impurity is diffused in the stabilizing resistor portion of the common polysilicon film, the resistance of that portion is low. Since the impurity is not diffused in the resistance sheet portion of the common polysilicon film, the original high resistance of that portion is maintained.

DETAILED DESCRIPTION OF THE PREFERRED EMBODIMENTS

Figure 1:
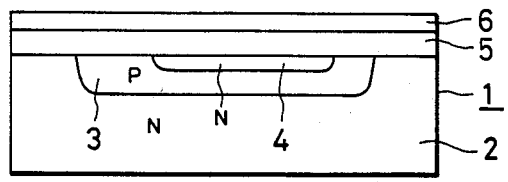
FIGS. 1, 2, 3 and 4 show explanatory views of manufacturing processes provided in accordance with the present invention.

An embodiment of the present invention will be described with reference to the drawings attached hereto. FIGS. 1, 2, 3 and 4 show the manufacturing processes of the method. In the manufacturing process shown in FIG. 1, impurities are diffused in an n-type silicon substrate 1 so that an n-type region, a p-type region and another n-type region are provided as a collector 2, a base 3 and an emitter 4, respectively. At that time, the pn junction between the collector 2 and the base 3 is exposed in the surface of the substrate 1. A silicon oxide film 5 is then provided on the entire surface of the substrate 1. A polysilicon film 6 is then provided on the surface of the silicon oxide film 5.

Figure 2:
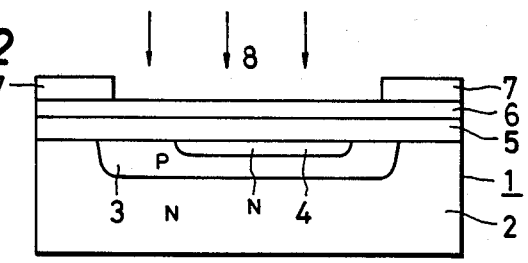

In the manufacturing process shown in FIG. 2, a photoresist film is provided on the polysilicon film 6 and then removed except portions 7 located over the portion (exposed on the surface of the substrate 1) of the pn junction between the collector 2 and the base 3. Then, ions 8 of, for example, phosphorus are implanted as impurities into the polysilicon film 6.

Figure 3:
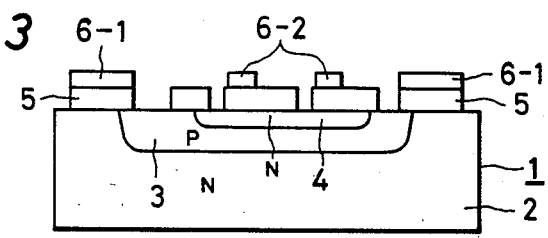

In the manufacturing process shown in FIG. 3, the photo resist film portions 7 are removed, and high-temperature heat treatment is then performed so that the strength of adhesion of the polysilicon film 6 and the silicon oxide film 5 is increased and the implanted impurities of phosphorus are diffused in the polysilicon film 6. The polysilicon film 6 and the silicon oxide film 5 are thereafter processed by photoetching so as to provide high-resistance polysilicon films 6-1 in which the impurities are not diffused, as passivation films over the portion (exposed on the surface of the substrate 1) of the pn junction between the collector 2 and the base 3, and low-resistance polysilicon films 6-2 in which the impurities are diffused, as stabilizing resistors over the emitter 4.

Figure 4:
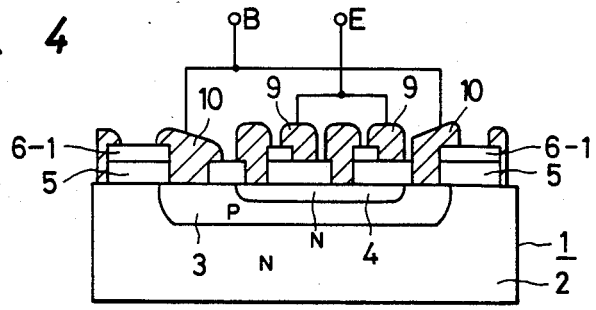

In the manufacturing process shown in FIG. 4, an electrode film of, for example, aluminum is provided on the substrate 1 and the films 5, 6-1 and 6-2 and processed to a prescribed pattern by photoetching so that emitter electrodes 9, base electrodes 10 and collector electrodes 11 are provided.

Although the ions 8 are implanted, in the manufacturing process shown in FIG. 2, into the polysilicon film 6, except its portions which are to become the high-resistance sheets over the pn junction between the collector 2 and the base 3, the resist film may be patterned to implant the ions 8 into only the polysilicon film portions which are to become the stabilizing resistors for the emitter 4.

As described above, according to the present invention, the stabilizing resistor for the emitter can be obtained by diffusing impurities into a single polysilicon film, so that the stabilizing resistor for the emitter and the passivation sheet for the pn junction can be produced through only one attachment of the polysilicon film. Accordingly, the number of steps taken to provide the polysilicon film and to perform photoetching is reduced to simplify the manufacturing processes of the method.

What is claimed is:

1. A method of manufacturing a semiconductor device with polysilicon resistors in which a base of a second conductivity type is provided in a semiconductor substrate of a first conductivity type, said semiconductor substrate of said first conductivity type being a collector, an emitter of said first conductivity type being provided in said base, pn junctions between said collector and said base being exposed on a surface of said semiconductor substrate, and said emitter being provided with low resistance stabilizing resistors, comprising the steps of:

providing a silicon oxide film on said surface of said substrate;

providing a polysilicon film on portions of said silicon oxide film above at least said emitter and said pn junctions between said collector and said base;

providing a resist film on said polysilicon film;

removing a portion of said resist film located above said emitter so that said resist film remains in place above said pn junctions between said collector and said base;

implanting ions having said first conductivity type into the portions of said polysilicon film above said emitter where said resist film has been removed;

heating said polysilicon film to diffuse said ions only into said portion of said polysilicon film above said emitter; and photoetching said polysilicon film and said silicon oxide film so as to form said low resistance stabilizing resistors above said emitter and high resistance films above said pn junctions between said collector and said base.

2. A method of manufacturing a semiconductor device with polysilicon resistors as claimed in claim 1, wherein said resist film is removed in such a pattern that said ions are implanted into only portions of said polysilicon film which become said stabilizing resistors.

* * * * *